United States Patent [19]

Idler

[11] Patent Number: 5,252,497
[45] Date of Patent: Oct. 12, 1993

[54] METHOD OF CHARACTERIZING OPTICAL PARAMETERS OF OPTO-ELECTRONIC COMPONENTS AND APPARATUS FOR CARRYING OUT THE METHOD, PARTICULARLY DURING A COATING OPERATION

[75] Inventor: Wilfried Idler, Asperg, Fed. Rep. of Germany

[73] Assignee: Alcatel N.V., Amsterdam, Netherlands

[21] Appl. No.: 739,803

[22] Filed: Aug. 1, 1991

Related U.S. Application Data

[63] Continuation-in-part of Ser. No. 304,168, Jan. 31, 1989, abandoned.

[30] Foreign Application Priority Data

Mar. 21, 1991 [DE] Fed. Rep. of Germany ....... 4109727

[51] Int. Cl.$^5$ ........................................... H01L 21/66
[52] U.S. Cl. ........................................ 437/8; 324/613
[58] Field of Search .................... 437/7, 8, 235, 238; 324/613, 719; 156/601; 422/105

[56] References Cited

U.S. PATENT DOCUMENTS

| | | | |
|---|---|---|---|
| 4,057,441 | 10/1991 | Gutt et al. | 437/8 |
| 5,024,853 | 6/1991 | Landreau et al. | 437/8 |
| 5,049,811 | 9/1991 | Dreyer et al. | 324/613 |

OTHER PUBLICATIONS

M. Serenyl, et al., "Directly Controlled Deposition...", Applied Optics, Mar. 1, 1987, vol. 26, No. 5, pp. 845.

*Primary Examiner*—Mary Wilczewski
*Attorney, Agent, or Firm*—Robbins, Berliner & Carson

[57] ABSTRACT

In the commonly used methods for the coating of opto-electronic components, especially of semiconductor lasers, the layer thickness of a layer that is to be deposited is measured optically. The optical signal is converted into an electrical one with which the coating is controlled.

The invention relates to the purely electrical interpretation of the high frequency component of the electrical noise power of an opto-electronic component (3) when a direct current passes through it. From the noise power, a controlling computer (10) derives a signal for control of the layer thickness; this is fed into a coating apparatus (14) of a coating reactor (2) which has a reacting chamber (1) containing the component (3) to be coated.

4 Claims, 3 Drawing Sheets

METHOD OF CHARACTERIZING OPTICAL PARAMETERS OF OPTO-ELECTRONIC COMPONENTS AND APPARATUS FOR CARRYING OUT THE METHOD, PARTICULARLY DURING A COATING OPERATION

CROSS REFERENCE TO RELATED APPLICATION AND CLAIM FOR PRIORITY

This application is a continuation-in-part of the commonly assigned U.S. patent application entitled "METHOD OF CHARACTERIZING OPTICAL PARAMETERS OF SEMICONDUCTOR LASERS AND ARRANGEMENT FOR CARRYING OUT THE METHOD", filed in the name of A. Mozer with an accompanying preliminary amendment on Jan. 31, 1989 under Ser. No. 07/304,168, now abandoned. To the extent such copending application and preliminary amendment may contain any additional information that might be of any assistance in the use and understanding of the invention claimed herein, they are hereby incorporated by reference. In addition, this application is based on and claims priority from a subsequent commonly assigned German application filed in the name of W. Idler under serial number P 41 09 727.0 on or about Mar. 21, 1991.

TECHNICAL FIELD

The invention relates to a method for coating an opto-electronic component and equipment for carrying out the method.

BACKGROUND ART

According to Applied Optics 26 (1987), pages 845-849, a method is known for coating semiconductor lasers with anti-reflection layers, specifically semiconductor lasers to be used in a system for coherent optical transmission. For this, the surface reflection at the light emitting sides must be minimized, especially if the semiconductor laser is the part of an external resonator. The refraction index of the layer must be selected with reference to the wavelength of the laser light emitted by the semiconductor laser and the refraction index of the wave conducting layer of the semiconductor laser.

A semiconductor laser, positioned in a reaction chamber of a coating reactor, is coated with silicon nitride. During the coating an alternating current is applied to the semiconductor laser, and the light emitted thereby by the semiconductor laser, filtered by an interference filter, is measured by a photodiode located outside the reaction chamber. The electric signal generated by the photodiode is made symmetric in a converter and is fed into a lock-in amplifier. The reflection capabilities and the thicknesses of the layers can be determined from the amplifier output signal.

The disadvantage of this method is in the high experimental expenditure required for the determination of the layer thicknesses, which is obtained through conversion and re-conversion between electrical and optical signals.

[German patent publication] DE 38 02 841 A1 describes a method for interpretation of electrical noise spectra, by which the optical properties of semiconductor lasers can be determined. However, this method is applicable only to semiconductor lasers already manufactured. There is no indication referring to manufacturing steps for semiconductor lasers based on interpretation of noise spectra.

DISCLOSURE OF INVENTION

The object of this invention is to provide a method and the equipment to carry out the method, simplifying the determination of the layer thickness.

The advantage of the invention is that the optical components, such as a grid spectrometer, used as the interferometer, and a photodiode for measuring the light emitted by the component are omitted and hereby also the problems of focussing the laser light on the grid spectrometer. The new equipment allows manufacturing of opto-electronic components, especially semiconductor lasers, with exactly determined layer thicknesses of the layers at the light emitting sides. These semiconductor lasers ensure a high optical amplification in their intended use, e.g. as transmitting lasers or travelling wave amplifiers.

BRIEF DESCRIPTION OF DRAWINGS

The invention is exemplarily explained hereunder with reference to the drawings. In so far as the invention addresses a method for coating a component, it will be explained in connection with the description of the equipment for the execution of the method. The drawings show.

BEST MODE FOR CARRYING OUT THE INVENTION

Figure 1:
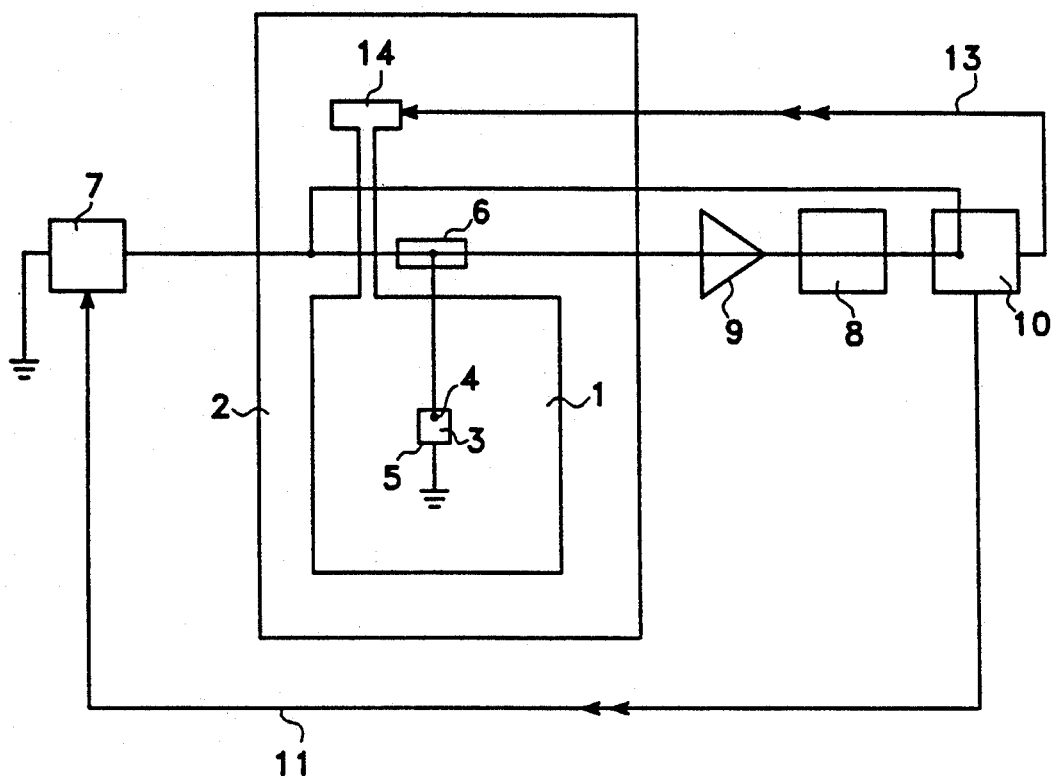
FIG. 1: the coating apparatus.

FIG. 1 shows the apparatus for the coating of opto-electrical components which consists of a coating reactor 2 equipped with a reaction chamber 1. The reaction chamber 1 contains at least one single opto-electronic component 3, to be coated with at least one dielectric layer. Normally, many components 3 are coated simultaneously, being positioned either side by side or end to end on a wafer, or on a flat bar, long side to long side.

A wafer holds anywhere from 5,000 to 10,000 semiconductor lasers, e.g. Fabry-Perot semiconductor lasers. On the flat bar there are positioned, for example, 40 to 50 DFB (Distributed Feed Back) semiconductor lasers.

The component 3 has an electric connection 4 at its top side and an electric connection 5 at its bottom side. On its bottom side the component has, preferably, a metallized surface which constitutes the connection 5, being preferably the electric ground. Via the connection 4 on its top side, the component 3 is connected to a branch-off circuit 6, commonly called a "Bias-T".

This branch-off, in turn, is connected with a direct current source 7 and a spectral analyzer 8.

The opto-electronic component 3, e.g. either a Fabry-Perot semiconductor laser or a DFB semiconductor laser, or an optical travelling wave amplifier, is being coated in at least one coating step with an electrical coating having a substantial influence on the optical parameters of the component. The coating consists of e.g. silicon nitride $Si_3N_4$ or a silicon oxide $SiO_x$.

During the one coating step, or several coating steps, a direct current flows from the direct current source 7 via the branch-off circuit 6 through the component 3 to the ground connection. During the direct current flow through the component 3, noise signals are generated which are superimposed over the direct current and which contain the optical parameters of the component.

The branch-off circuit 6 separates electrically the noise signals from the direct current and passes only the noise signals to the spectrum analyzer 8. A grossly simplified example for the branch-off circuit 6 is a capacitor wired ahead of the spectrum analyzer 8. The branch-off circuit 6 preferably passes only noise signals in the high frequency range, e.g. above 100 MHz, in order to also suppress those noise signals that are produced by interfering radio sources, or electrical components other than the component 3.

The spectrum analyzer 8 accepts the electrical noise spectra preferably in a narrow frequency range of e.g. 3 MHz around a medium frequency of e.g. 150 MHz by measuring the electrical noise power of the component 3.

The path from the spectrum analyzer 8 to the branch-off circuit connector 6 preferably contains an electrical amplifier 9 for amplification of the noise power.

The electrical noise power, measured by the spectrum analyzer 8, is transferred to a controlling computer 10. This computer controls the direct current source 7 via a control conductor 11.

Figure 2:
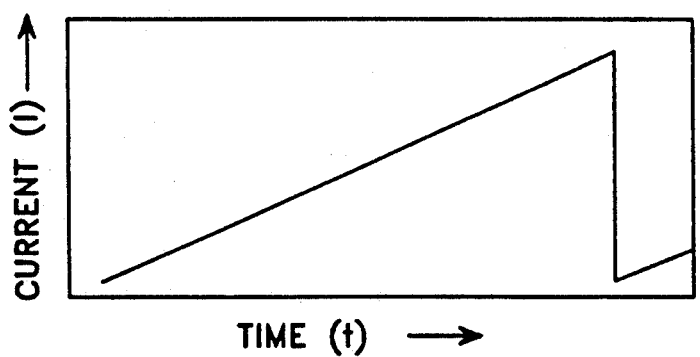
FIG. 2: a direct current, generated by a direct current source, uniformly increasing as a function of time.

On the basis of the control signals by the controlling computer 10, the direct current source 7 generates, for instance, a direct current which increases in uniform time intervals, and at a constant rate of rise, from a minimum value to a maximum value. A direct current of this type is shown as a function of time in FIG. 2.

Figure 3:
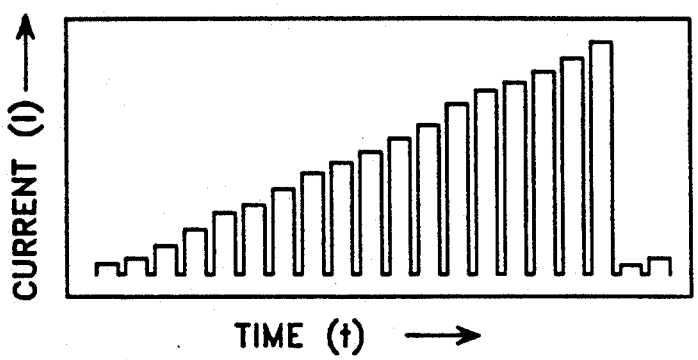
FIG. 3: a direct current, generated by a direct current source, increasing in pulses as a function of time.

In the other case (FIG. 3) the direct current increases during the same time interval in rectangular pulses, until it reaches the maximum value. Thereafter it starts anew at the minimum value.

The direct current generated by the direct current source is supplied to the controlling computer 10 via a conductor 12.

Thus, the controlling computer 10 obtains the electrical noise power of the component 3 as a function of the direct current passing through the latter. Herefrom it generates a signal for the control of the layer thickness of the dielectric layer. This signal is fed, via a control conductor 13, into a coating apparatus 14, which also is part of the coating reactor 2. Within the coating apparatus 14, based on this signal from the reaction chamber 1, material for the coating of component 3 either continues to be delivered, or the coating process is terminated. When several materials are provided for depositing the dielectric layer simultaneously or in succession, the signal can cause either a composition change of the coating material, or the point in time for the change of the material just being deposited can be set by the controlling computer 8.

Figure 4:
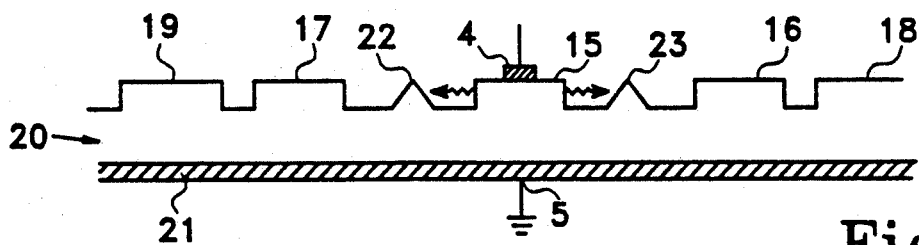
FIG. 4: a Fabry-Perot semiconductor laser on a flat bar in cross section.

This equipment allows coating, for instance, Fabry-Perot semiconductor lasers 15-19 as depicted in FIG. 4. By the coating, the Fabry-Perot semiconductors 15-19 are to have on their front light emitting side a high light emission power, and on their rear light emitting side a low light emission power.

The Fabry-Perot semiconductor lasers 15-19 are placed on a wafer 20 which has on its bottom side a contact layer 21 which serves as ground connection, corresponding to connection 5 in FIG. 1. Only the Fabry-Perot semiconductor laser 15 has the electrical connector 4, through which the direct current flows to the contact layer 21 while the dielectric layer is being deposited. In this case the Fabry-Perot semiconductor laser 15 the opto-electric component 3 shown in FIG. 1, selected for the determination of the layer thickness of the layer, because all the Fabry-Perot semiconductor lasers 15-19 on the wafer 20 are built sufficiently homogenous and are uniformly coated with the layer during the coating operation. When a direct current flows through a Fabry-Perot semiconductor laser 15 equipped with the electrical connectors 4, 5 it emits light from its waveguide layer through its light emitting sides. To prevent this light from being reflected back into it by the neighboring Fabry-Perot semiconductor lasers, 16-17, the wafer 20 has ridges 22, 23 with a triangular cross section which eliminate this.

Since the Fabry-Perot semiconductor lasers 15-19 should have a highly reflective coating on one light emitting side, and a highly anti-reflective coating on the other light emitting side, they are given a protective coating on one light emitting side during a first coating operation, to prevent the dielectric layer from being deposited on this light emitting side.

Figure 5:
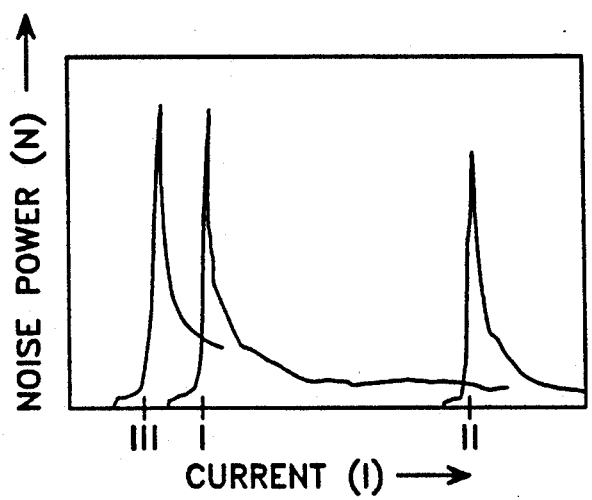
FIG. 5: the electrical noise power of a Fabry-Perot semiconductor laser at the first coating pass, as a function of the direct current applied to it.

FIG. 5 shows the noise power of the Fabry-Perot semiconductor laser 15 as a function of the direct current applied to it, as determined by the controlling computer 10. Prior to the coating the latter is represented by a curve with a peak I, which corresponds to the threshold current of the Fabry-Perot semiconductor laser 15.

Figure 6:
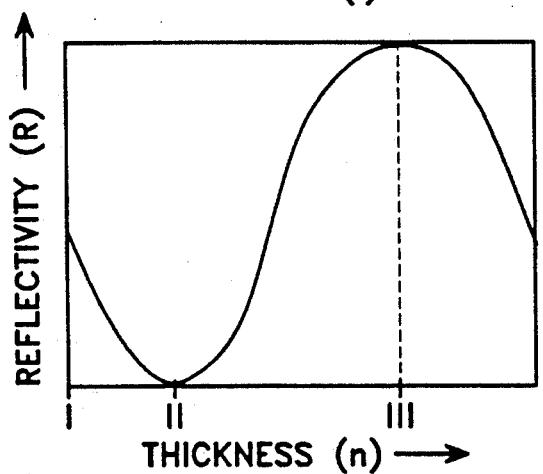
FIG. 6: the reflectivity of the Fabry-Perot semiconductor laser as a function of the layer thickness of the dielectric layer deposited during the first coating pass.

In a presentation of the reflectivity of the Fabry-Perot semiconductor laser 15 as a function of the layer thickness as shown in FIG. 6, a starting value of the reflectivity corresponds to the peak I. The reflectivity is defined as the quotient of the light intensity reflected at the light emitting side and the light intensity beamed onto it. The reflectivity is a periodic function with the layer thickness of the dielectric layer.

When a certain layer thickness is reached in the course of the vapor deposition process, the maximum of the curve in FIG. 5 shifts to a peak II, which corresponds to a higher threshold current. To this corresponds a minimum II of the reflectivity in FIG. 6. At extended coating, the maximum of the curve in FIG. 5 will shift to a peak III corresponding to a minimum of the threshold current which corresponds to a reflectivity maximum III. Hereby, a strongly mirrored light emitting side of the Fabry-Perot semiconductor lasers 15-19 is produced, from which maximally 5% of the light intensity can exit.

Following this, etching removes the protective coat which covered the other light emitting side of the Fabry-Perot semiconductor lasers 15-19 and the already coated light emitting side is covered, in order to coat in a second coating operation exclusively the as yet not coated second light emitting side. Since an as high as possible light intensity shall be emitted, this side must have a low reflectivity.

Figure 7:
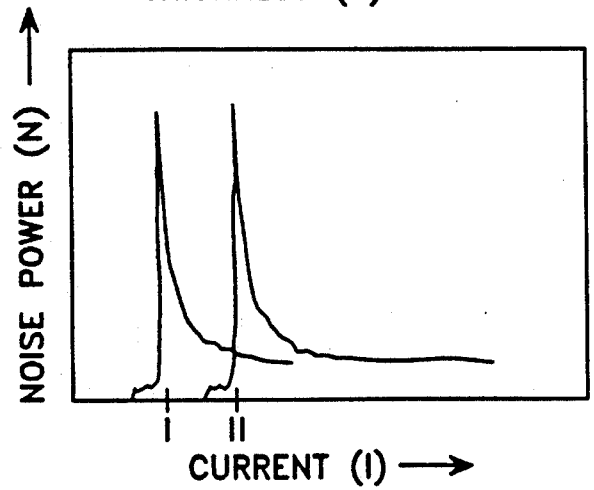
FIG. 7: the electrical noise power of the Fabry-Perot semiconductor laser at the second coating pass, as a function of the direct current applied to it.

FIG. 7 shows again the electrical noise power of the Fabry-Perot semiconductor laser 15 as a function of the direct current applied to it, as measured by the controlling computer 10 during the coating of the second light emitting side. Depicted is a curve with a peak I as measured at the start of this coating operation. The course of this curve coincides, with unimportant deviations, with the course of the curve with the peak III in FIG. 5, because the removal of the protective coat at this light emitting side and the application of a protective coat at the other light emitting side has no noticeable effect on the noise spectrum.

Figure 8:
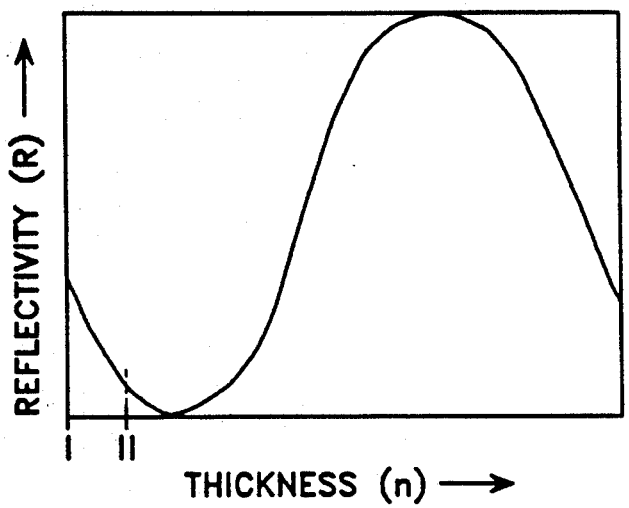
FIG. 8: the reflectivity of the Fabry-Perot semiconductor laser as a function of the layer thickness of the dielectric layer deposited during the second coating pass.

Correspondingly, there is, as shown in FIG. 8, where again the reflectivity is drawn as a function of the layer thickness, also for the second light emitting side a similar course with a starting value I to which belongs a curve with a peak I. At conclusion of the coating a value II (FIG. 8) of the reflectivity is arrived at, to which corresponds a peak II in FIG. 7. With the attainment of this value II (FIG. 8) the objective of both coating operations is accomplished: all of the Fabry-Perot semiconductor lasers each have each highly reflecting side and one highly light permeable light emitting side, the latter having a light permeability of 95%. Furthermore, the laser threshold current after the coating has the same value as before the coating.

The DFB semiconductor lasers are positioned, as already mentioned above, on a flat bar. Their light emitting sides are created by two opposing each other side edges of the flat bar. In the case of DFB semiconductor lasers, the light emitting sides are simultaneously coated in a single coating operation, so that the mode spectrum of the DFB semiconductor laser can be influenced, to make it suitable as e.g. a single mode transmission laser.

Figure 9:
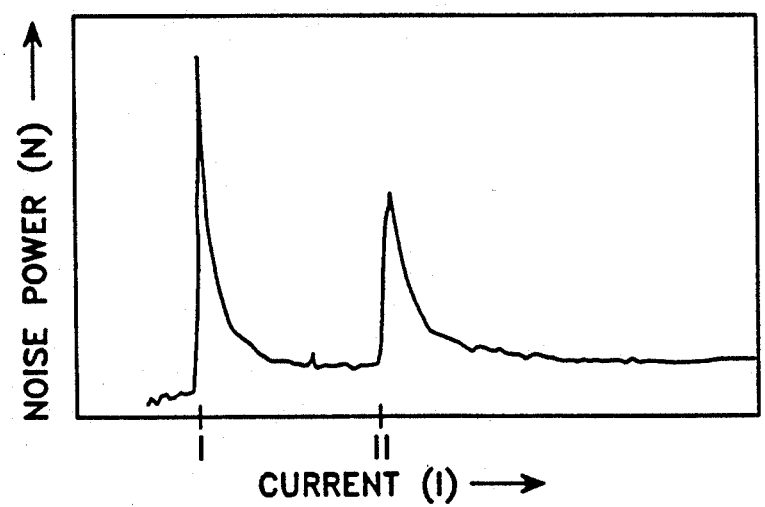
FIG. 9: the electrical noise power of a DFB semiconductor laser prior to the coating, as a function of a direct current applied to it.

A noise spectrum of the DFB semiconductor laser in FIG. 9 shows peaks I and II in the electrical noise power. The DFB semiconductor laser thus has two threshold currents, having exemplarily an amperage of 20 mA and 55 mA. The difference between the two is thus 35 mA. In this range the DFB semiconductor laser operates in a single mode with a side mode suppression of more than 30 dB, while above the threshold current of 55 mA it operates in a dual mode with a side mode suppression of less than 10 dB.

Figure 10:
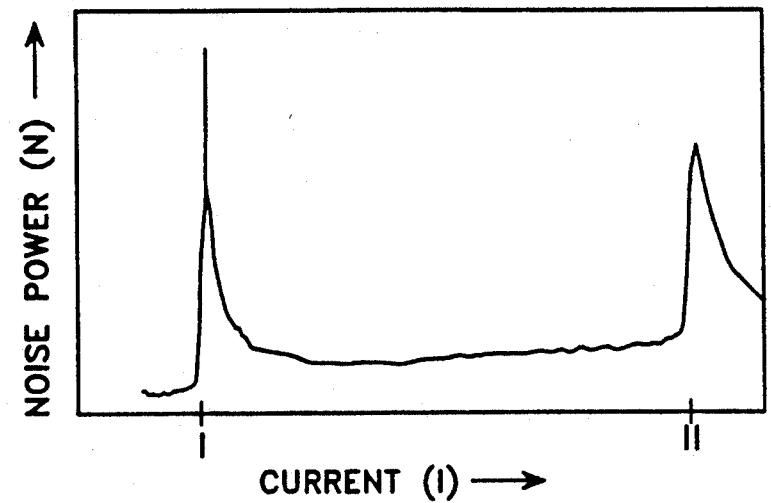
FIG. 10: the electrical noise power of the DFB semiconductor laser after the coating, as a function of a direct current applied to it.

To improve this side mode suppression, the DFB semiconductor lasers are coated in the reaction chamber 1. Consequently, the peak I (FIG. 10) remains unchanged at the same location in the noise spectrum, while the peak II shifts to a higher direct current value, until it has reached an amperage of 150 mA or 200 mA. From this has emerged a single mode DFB semiconductor laser, suitable for the optical message transmission at 1550 nm, which can be for example modulated electrically with a high modulation signal.

The coating method for DFB semiconductor lasers also allows coating optical travelling wave amplifiers which are vapor deposited either on a flat bar or on a wafer and which have the same layer structure as Fabry-Perot semiconductor lasers. They are coated in one single coating operation until the reflectivity of their light emitting sides turns minimal.

Besides this, other optical components, e.g. photodiodes or phototransistors, can be coated, by means of interpreting the electrical noise spectra, with a dielectric layer whose optical parameters e.g. the reflectivity can be optimized.

I claim:

1. Method of coating an optoelectronic component having terminals with a dielectric layer, comprising the steps:
   supplying a direct current through the terminals to the component during the coating process,
   determining an electrical parameter of an electrical noise spectrum which is superimposed on the direct current by the component,
   feeding the electrical parameter to a control computer for deriving a control signal corresponding to an optical parameter of the device, and
   coating the component with a dielectric layer whose thickness is controlled by the control signal.

2. A method as claimed in claim 1, wherein a spectrum analyzer determines the electrical parameter of the electrical noise spectrum by measuring electrical noise power of the electrical noise spectrum, and the control computer determines the electrical noise power of the component as a function of the direct current flowing through the component and derives said control signal from said function.

3. A method as claimed in claim 2, wherein the control computer controls a direct-current source which generates said direct current.

4. Arrangement for coating an optoelectronic component having terminals with a dielectric layer, said arrangement comprising a reaction chamber, for containing the component,
   a branching circuit,
   a direct-current source coupled to a common terminal of said component via said branching circuit, for supplying a direct current through the terminals to the component during the coating process,
   a spectrum analyzer also coupled to said common terminal via said branching circuit, for determining noise power of an electrical noise spectrum which is superimposed on the direct current by the component,
   a control computer responsive to said noise power, for deriving a control signal corresponding to an optical parameter of the device, and
   a coating apparatus responsive to said control signal, for applying a controlled thickness of said dielectric to the component while the component is inside the reaction chamber and is connected to the direct-current source.

* * * * *